(12) United States Patent
Van Empel et al.

(10) Patent No.: US 8,072,575 B2
(45) Date of Patent: Dec. 6, 2011

(54) LITHOGRAPHIC APPARATUS WITH TEMPERATURE SENSOR AND DEVICE MANUFACTURING METHOD

(75) Inventors: Tjarko Adriaan Rudolf Van Empel, Eindhoven (NL); Paulus Bartholomeus Johannes Schaareman, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 433 days.

(21) Appl. No.: 12/390,125

(22) Filed: Feb. 20, 2009

(65) Prior Publication Data

US 2009/0213344 A1 Aug. 27, 2009

Related U.S. Application Data

(60) Provisional application No. 61/064,200, filed on Feb. 21, 2008.

(51) Int. Cl.
*G03B 27/52* (2006.01)

(52) U.S. Cl. .................. 355/30; 355/52; 355/67

(58) Field of Classification Search .......... 355/30, 355/52, 67
See application file for complete search history.

(56) References Cited

U.S. PATENT DOCUMENTS

| | | | |
|---|---|---|---|
| 5,087,312 A | 2/1992 | Gerber et al. | |
| 6,670,538 B2 * | 12/2003 | Wilner et al. | 136/230 |
| 6,886,351 B2 * | 5/2005 | Palfy et al. | 62/140 |
| 6,909,093 B2 * | 6/2005 | Sato et al. | 250/338.4 |
| 6,991,368 B2 * | 1/2006 | Gerlitz | 374/121 |
| 7,440,076 B2 * | 10/2008 | Kuit et al. | 355/30 |
| 7,897,110 B2 | 3/2011 | Banine et al. | |
| 2002/0139410 A1 * | 10/2002 | Wilner et al. | 136/224 |
| 2006/0285091 A1 * | 12/2006 | Parekh et al. | 355/30 |
| 2007/0070324 A1 * | 3/2007 | Kuit et al. | 355/72 |
| 2007/0076218 A1 | 4/2007 | Van Empel et al. | |

FOREIGN PATENT DOCUMENTS

| | | |
|---|---|---|
| JP | 03-189526 A | 8/1991 |
| JP | 06-501550 A | 2/1994 |
| JP | 2001-143992 A | 5/2001 |
| JP | 2005-221238 A | 8/2005 |
| JP | 2006-208177 A | 8/2006 |
| JP | 2006-332146 A | 12/2006 |
| JP | 2007-129202 A | 5/2007 |
| JP | 2007-173805 A | 7/2007 |
| JP | 2007-333558 A | 12/2007 |

OTHER PUBLICATIONS

English language Abstract of Japanese Patent Publication No. 03-189526 A, published Aug. 19, 1991; 1 page.

(Continued)

*Primary Examiner* — Edward Glick
*Assistant Examiner* — Thomas R Artman
(74) *Attorney, Agent, or Firm* — Sterne, Kessler, Goldstein & Fox P.L.L.C.

(57) ABSTRACT

In an embodiment, a lithographic apparatus is arranged to transfer a pattern from a patterning device onto a substrate, wherein the lithographic apparatus includes an air shower and a temperature sensor positioned near the air shower for measuring the temperature of an air stream in the air shower. The temperature sensor is a thermocouple sensor, e.g., of a thermopile arrangement type. The thermocouple sensor includes a plurality of thermocouples in series, wherein a cold junction and a hot junction are provided, the cold junction being connected to a heat sink, and the hot junction being positioned into the air stream of the air shower.

13 Claims, 3 Drawing Sheets

OTHER PUBLICATIONS

English language Abstract of Japanese Patent Publication No. 2001-143992 A, published May 25, 2001; 1 page.

English language Abstract of Japanese Patent Publication No. 2005-221238 A, published Aug. 18, 2005; 1 page.

English language Abstract of Japanese Patent Publication No. 2006-208177 A, published Aug. 10, 2006; 1 page.

English language Abstract of Japanese Patent Publication No. 2006-332146 A, published Dec. 7, 2006; 1 page.

English language Abstract of Japanese Patent Publication No. 2007-129202 A, published May 24, 2007; 1 page.

English language Abstract of Japanese Patent Publication No. 2007-173805 A, published Jul. 5, 2007; 1 page.

English language Abstract of Japanese Patent Publication No. 2007-333558 A, published Dec. 12, 2007; 1 page.

Japanese Notice of Reasons for Rejection directed to related Japanese Patent Application No. 2009-030672, the Japanese Patent Office, mailed May 16, 2011; 5 pages.

* cited by examiner

LITHOGRAPHIC APPARATUS WITH TEMPERATURE SENSOR AND DEVICE MANUFACTURING METHOD

CROSS-REFERENCE TO RELATED APPLICATIONS

The present application claims the benefit of U.S. Provisional Patent Appl. No. 61/064,200, filed Feb. 21, 2008, which is incorporated by reference herein in its entirety.

BACKGROUND

1. Field

Embodiments of the present invention relate to a lithographic apparatus with a temperature sensor and a method for manufacturing a device.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, air showers are used to provide an air stream to various parts of the lithographic apparatus. More generally, fluid showers are provided which provide a fluid stream. This temperature is usually measured using NTC (negative temperature coefficient) temperature sensors, which are readily available in a variety of specifications. However, in an environment where temperatures have to be measured with a resolution in the sub mK range, the self-heating of NTC temperature sensors may cause erroneous measurements. Also the response time of these measurements can be too slow to be able to effectively control the environment inside the lithographic apparatus.

SUMMARY

The inventors have invented a temperature sensor which has sufficient sensitivity, accuracy, and a high enough band width for use in a lithographic apparatus.

According to an aspect of the invention, there is provided a lithographic apparatus arranged to transfer a pattern from a patterning device onto a substrate, wherein the lithographic apparatus includes an air shower and a temperature sensor positioned near the air shower for measuring the temperature of an air stream in the air shower, wherein the temperature sensor is a thermocouple sensor.

According to an aspect of the invention, a device manufacturing method is provided including transferring a pattern from a patterning device onto a substrate, wherein an air shower is used to provide an air stream including measuring the temperature of an air stream in the air shower with a temperature sensor, wherein the temperature sensor is a thermocouple sensor.

According to an aspect of the invention, there is provided the use of a temperature sensor in a lithographic apparatus, wherein the temperature sensor measures the temperature of an air stream, wherein the temperature sensor is a thermocouple sensor.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 3A:
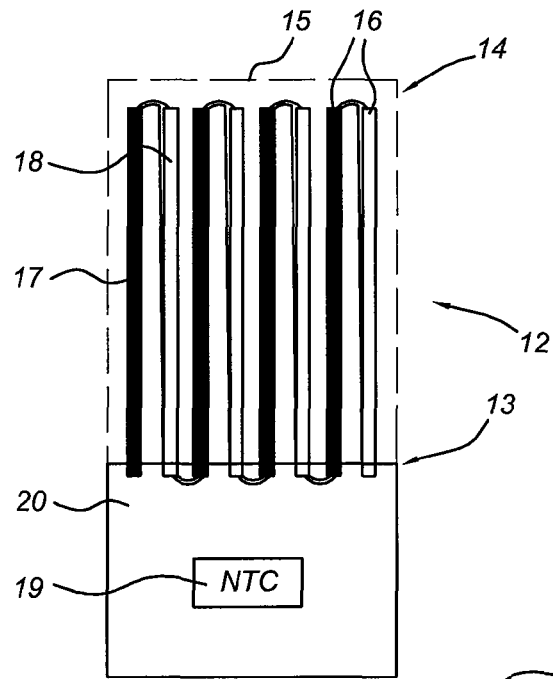

FIGS. 3a, b and c depict cross sectional views of three embodiments of a thermopile temperature sensor as used in embodiments of the present invention.

Figure 4:
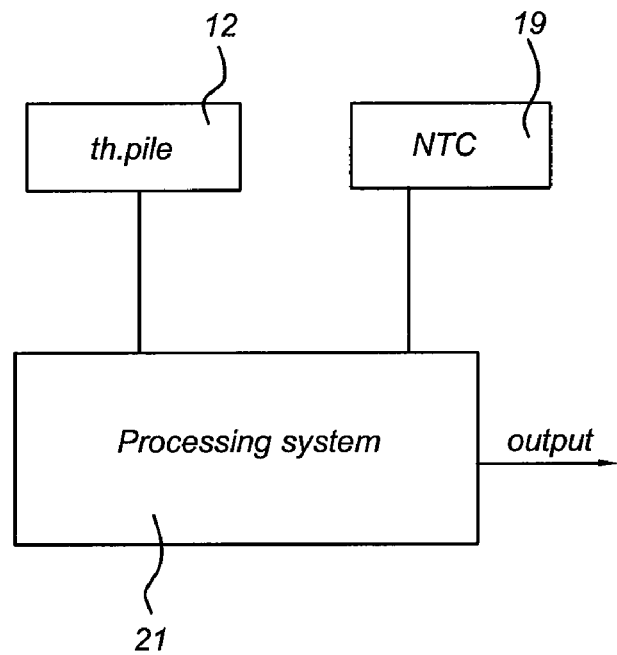

FIG. 4 depicts a schematic diagram of a processing system to which the temperature sensor is connected, according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
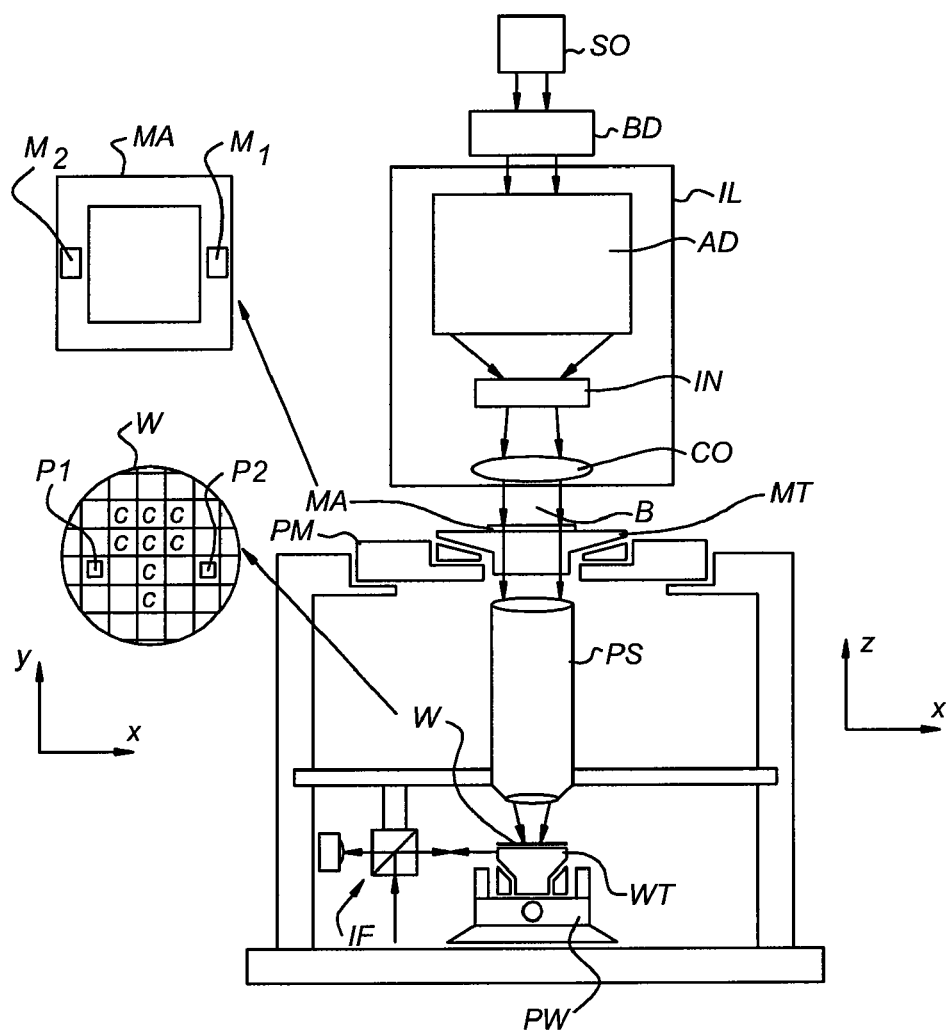
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g., UV radiation radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PS configured to project a pattern imparted to radiation beam B by patterning device MA onto a target portion C (e.g., including one or more dies) of substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with beam delivery system BD if required, may be referred to as a radiation system.

Illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto a target portion C of substrate W. With the aid of second positioner PW and position sensor IF (e.g., an interferometric device, linear encoder or capacitive sensor), substrate table WT can be moved accurately, e.g., so as to position different target portions C in the path of radiation beam B. Similarly, first positioner PM and another position sensor (which is not explicitly depicted in FIG. 1) can be used to accurately position mask MA with respect to the path of radiation beam B, e.g., after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus could be used in at least one of the following modes:

1. In step mode, mask table MT and substrate table WT are kept essentially stationary, while an entire pattern imparted to the radiation beam is projected onto a target portion C at one time (i.e., a single static exposure). Substrate table WT is then shifted in the X and/or Y direction so that a different target portion C can be exposed. In step mode, the maximum size of the exposure field limits the size of the target portion C imaged in a single static exposure.

2. In scan mode, mask table MT and substrate table WT are scanned synchronously while a pattern imparted to the radiation beam is projected onto a target portion C (i.e., a single dynamic exposure). The velocity and direction of substrate table WT relative to mask table MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
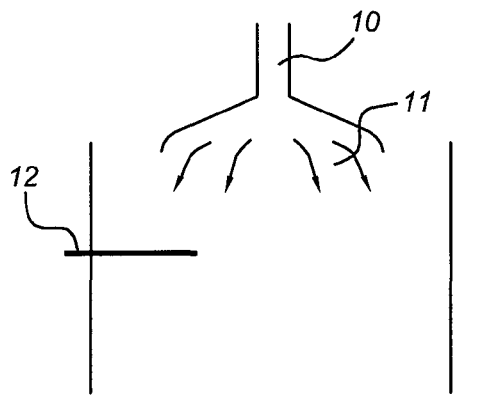
FIG. 2 depicts a schematic view of a part of the lithographic apparatus, in which an air shower is provided with a temperature sensor according to an embodiment of the present invention.

A lithographic apparatus includes a carefully controlled inner environment. For this a number of air showers are present in the lithographic apparatus, which provide a controlled air stream to certain parts of the lithographic apparatus, such as the cavity where substrate table WT is positioned, or spaces in the lithographic apparatus where measurement systems or projections systems are located. In FIG. 2, a schematic diagram is shown of an air shower 10, which provides a controlled air stream 11 in the lithographic apparatus. A temperature sensor 12 is positioned in air stream 11 to measure the temperature of air stream 11 for control purposes. The air stream temperature (at various locations inside the lithographic apparatus) may be used as a control parameter by the control circuitry of the lithographic apparatus. It is noted that in the following description the use of the temperature sensor is discussed as relating to air flows. However, the present invention embodiments may also be used to measure temperature in other gas flows or, more generally, in fluid flows.

Air temperature may be measured with NTC sensors, which are applied in many present day lithographic apparatus. Switched in a Wheatstone bridge, used with very little power and very advanced amplifier electronics, it is possible to reach 0.01 mK resolution and noise at several mK self-heating. However, a number of problems can arise when using NTC temperature sensors in lithographic apparatus applications. The current used in obtaining a good signal from an NTC can lead to about one µW power being dissipated in the NTC. This electric dissipation causes the NTC to heat up, reaching a temperature (10 mK) higher than the surrounding gas temperature in the air stream 11. As the air speed changes the NTC self-heating changes so temperature variation is detected due to an air speed variation. Reducing the NTC self-heating directly impacts the resolution and noise performance. Using multiple NTC's in one Wheatstone bridge to share the dissipation shares the heat-load, but more than a factor 10 is difficult to reach when the sensor is large. Then not a local temperature but rather an average temperature is measured. Furthermore, a slow response time may result, typically about two seconds. In this case, the temperature variations detected have already passed by the time they are observed and the amplitude measured is only a small fraction of the true amplitude for frequencies >0.1 Hz.

Embodiments in accordance with the present invention thus seek to measure air temperature at sub mK level and at high band width (e.g., 100 Hz) without significant self-heating related flow sensitivity. This can be used, for example, for interferometer distance measurement correction in a lithographic apparatus as described above in relation to FIG. 1.

It has been found that thermocouples, when used as temperature sensor 12, have an intrinsic much lower self-heating as voltage is measured instead of resistance. There are two disadvantages to a thermocouple however: the low signal strength (several µV/K up to a few 100 µV/K, depending on the material combination) and the cold and hot joint. The first disadvantage can be overcome by switching numerous thermocouples in series, for example on a thin film, thus obtaining a thermopile sensor. In this manner, the signal can be increased by for example a factor 100 to several mV/K or several µV per milli-Kelvin in a small volume.

In FIG. 3a a cross sectional view of a first embodiment of a thermopile temperature sensor 12 is shown. Thermopile temperature sensor 12 includes a substrate or carrying layer 15, on which a number of thermocouples 16 are provided in a series configuration. In the view of FIG. 3a, the alternating first and second materials 17, 18 are indicated by different shading. Substrate 15 is in this embodiment provided as a film of substrate material, e.g., Kapton or polyimide, with a thickness of, e.g., 10 µm. Alternating first and second materials 17, 18 of thermopile 12 are in this embodiment formed by p and n type silicon patterns provided on substrate 15. In an alternative embodiment, more standard thermocouple materials like constantan/copper or Fe/constantan patterns are used as first and second materials 17, 18. Thermocouples 16 are provided with a cold junction 13 and a hot junction 14. Cold junction 13 is connected to a heat sink 20, which is provided with a further temperature sensor 19, e.g., an NTC sensor, which measures the temperature of cold junction 13. This further temperature sensor 19 is allowed to have less stringent characteristics with respect to self-heating and bandwidth.

Figure 3B:
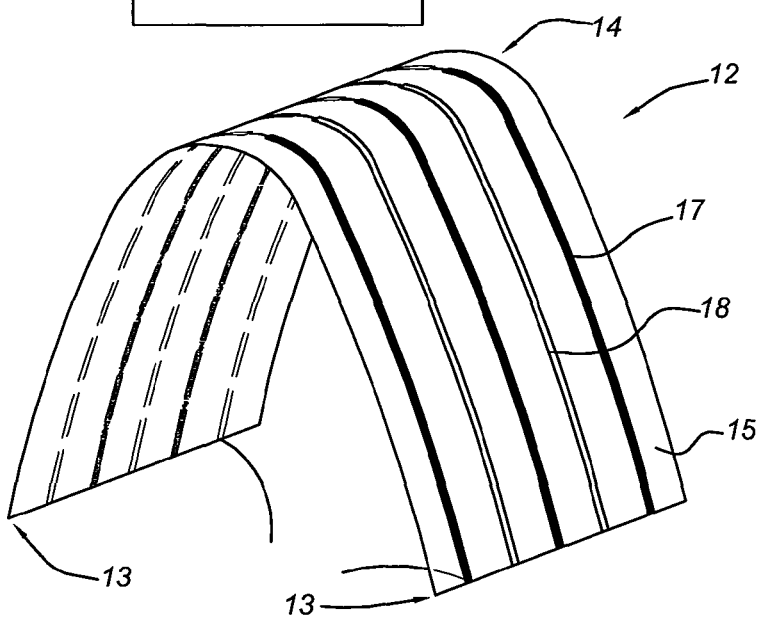

In FIG. 3b, a second embodiment is shown schematically. As the patterns of thermocouples 16 can be quite thin and narrow a lot of these thermocouples 16 can be placed on substrate 15, e.g., in the form of a foil of say 1×2 cm area, thereby creating a thermopile with good measurement characteristics. In the embodiment shown in FIG. 3b, a symmetrical layout of thermopile temperature sensor 12 is provided, where the ends (e.g., 1 cm length) of foil 15 with thermocouples 16 form cold junctions 13 and the center of foil 15 with thermocouples 16 forms hot junction 14. Foil 15 is thus folded in an 180 degree bend and both cold junctions 13 mounted in a heat sink 20, e.g., in the form of an aluminum block 5×5×10 mm in size. This heat sink 20 is further provided with an NTC sensor 19 for cold side reference. The bent middle part of the curved foil 15 can be positioned into the air stream 11 (see FIG. 2) so hot junction 14 is properly conditioned by air stream 11.

In an exemplary embodiment, a thermopile temperature sensor 12 is formed on a Kapton foil 15, having a foil length of 1 cm, a foil width of 5 mm and a thickness of 10 µm. A total of 400 thermocouple pairs 16 of n-type an p-type silicon (with a thickness of 0.4 µm) are formed on the foil 15, each having a sensitivity of 400 µV/K, resulting in a total sensitivity of 0.04 V/K. The dissipation of this exemplary thermopile sensor 12 due to self-heating was found to be negligible.

The thermopile measures a temperature difference between the cold joint or cold junction 13 and the hot joint or hot junction 14. So, when the temperature on one side is known, the temperature of the other side can be derived. As in the embodiment described above, the reference side of thermopile temperature sensor 12 can be clamped in heat sink 20 (e.g., a relatively big block of aluminum) and the temperature of heat sink 20 is determined using NTC sensor 19. For this side a low response time is an advantage and a small amount of self-heating of heat sink 20 caused by NTC sensor 19 is not a problem.

The other side of the thermopile will be placed in the "to be measured" air stream 11. As this side can be extremely thin, has negligible self-heating and good signal to noise ratio, here the air temperature can be measured fast and precise without the disadvantage of self-heating related flow speed susceptibility.

Figure 3C:
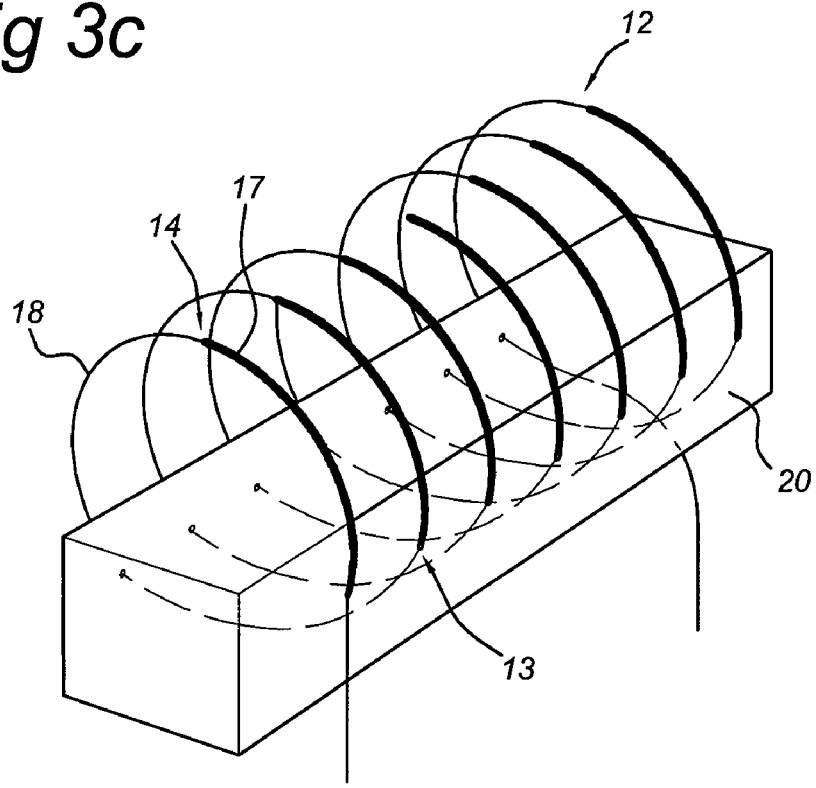

An even further embodiment of the temperature sensor according to the present invention is shown schematically in FIG. 3c. In this embodiment, thermocouples 16 are formed from wire-like materials 17, 18. Again, cold junctions 13 are provided in a heat sink 20 for cold side reference, and hot junctions 14 are suspended to allow air to flow freely over hot junctions 14.

In FIG. 4 the measurement subsystem is shown schematically related to air stream 11 temperature measurement using a thermopile temperature sensor 12 according to an embodiment of the present invention. Thermopile temperature sensor 12 and NTC sensor 19 are connected to a processing system 21. Processing system 21 controls and receives the measurement signals from thermopile temperature sensor 12 and NTC sensor 19, and processes these into a measurement signal. This measurement signal can then used by the overall control system of the lithographic apparatus, or by one or more internal subsystems of the lithographic apparatus, such as interferometer based positioning system of substrate W and/or mask M. Other application in the lithographic apparatus include, but are not limited to, temperature measurement in air showers 10 providing air to e.g., subsystems provided with interferometers, such as level sensor, and alignment and imaging units.

In a first aspect, the present invention relates to a lithographic apparatus arranged to transfer a pattern from a patterning device onto a substrate as described in the introduction above. In a further embodiment, thermocouple sensor 12 is of a thermopile arrangement type. This allows a sufficient high signal strength to be obtained from the sensor when measuring very small temperatures or temperature differences.

In a further embodiment, thermocouple sensor 12 includes a thin film substrate 15 and a plurality of thermocouples 16 in series, wherein the thin film substrate is bent to provide two ends which form a cold junction and a middle part which forms a hot junction, the two ends being connected to a heat sink 20, and the hot junction being positioned into the air stream of air shower 11.

Thin film substrate 15 is in a further embodiment made of Kapton material, which is readily available and easy to handle. As an alternative, a polyimide material may be used.

Thermocouples 16 include n-type and p-type silicon materials 17, 18 provided on thin film substrate 15 in a further embodiment. As an alternative, thermopile temperature sensor 12 is formed using constantan and copper patterns as first and second materials 17, 18.

In a further embodiment, the heat sink includes a metal block, e.g., an aluminum block. This provides sufficient thermal mass to keep the two ends of thermopile temperature sensor 12 (cold joints) at a stable temperature. Heat sink 20 is provided with an NTC sensor 19 in a further embodiment for providing a reference signal for the cold junction of thermocouple sensor 12.

In a further aspect, the present invention relates to a device manufacturing method as described in the introduction, wherein the temperature sensor is similar to one of the embodiments described above. Also the present invention relates to the use of a temperature sensor as defined in the introduction, wherein the temperature sensor is similar to one of the embodiments described above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus arranged to transfer a pattern from a patterning device onto a substrate, wherein the lithographic apparatus comprises an air shower and a temperature sensor positioned near the air shower for measuring a temperature of an air stream in the air shower, wherein the temperature sensor is a thermocouple sensor, wherein the thermocouple sensor comprises a first thermocouple and second thermocouple configured in series, wherein a cold junction and a hot junction are provided, the cold junction being coupled to a heat sink, and the hot junction being positioned in the air stream of the air shower, and wherein the air stream passes over the first thermocouple prior to passing over the second thermocouple.

2. The lithographic apparatus of claim 1, wherein the thermocouple sensor is configured as a thermopile.

3. The lithographic apparatus of claim 1, wherein the thermocouples comprise n-type and p-type silicon materials provided on a thin film substrate.

4. The lithographic apparatus of claim 3, wherein the thin film substrate comprises Kapton.

5. The lithographic apparatus of claim 1, wherein the heat sink comprises a metal block.

6. The lithographic apparatus of claim 1, wherein the heat sink is provided with a further temperature sensor for providing a reference signal for the cold junction of the thermocouple sensor.

7. A device manufacturing method comprising:
transferring a pattern from a patterning device onto a substrate;
providing an air shower including an air stream; and
measuring a temperature of an air stream in the air shower using a temperature sensor, wherein the temperature sensor is a thermocouple sensor, wherein the thermocouple sensor comprises a first thermocouple and second thermocouple configured in series, wherein a cold junction and a hot junction are provided, the cold junction being coupled to a heat sink, and the hot junction being positioned in the air stream of the air shower, and wherein the air stream passes over the first thermocouple prior to passing over the second thermocouple.

8. A device manufacturing method according to claim 7, wherein the thermocouple sensor comprises a thermopile.

9. A device manufacturing method according to claim 7, wherein the heat sink is provided with a further temperature sensor for providing a reference signal for the cold junction of the thermocouple sensor.

10. A method of measuring a temperature in a lithographic apparatus, comprising:
measuring a temperature of an air stream in an air shower of the lithographic apparatus, wherein the measuring comprises sensing the temperature with a thermocouple sensor, wherein the thermocouple sensor comprises a first thermocouple and second thermocouple configured in series, wherein a cold junction and a hot junction are provided, the cold junction being coupled to a heat sink, and the hot junction being positioned in the air stream of the air shower, and wherein the air stream passes over the first thermocouple prior to passing over the second thermocouple.

11. A method according to claim 10, wherein the thermocouple sensor comprises a thermopile.

12. A method according claim 10, further comprising:
sensing a temperature of the heat sink with a further temperature sensor; and
using the sensed temperature of the heat sink as a reference signal for the cold junction of the thermocouple sensor.

13. A method according to claim 12, wherein the further temperature sensor comprises a negative temperature coefficient (NTC) sensor.

* * * * *